US00RE49891E

(19) United States
(12) Reissued Patent
Shin et al.

(10) Patent Number: US RE49,891 E
(45) Date of Reissued Patent: Mar. 26, 2024

(54) ORGANIC LIGHT EMITTING DISPLAY DEVICE AND METHOD OF MANUFACTURING THE SAME

(71) Applicant: Samsung Display Co., Ltd., Yongin-si (KR)

(72) Inventors: Hye-Jin Shin, Yongin-si (KR); Won-Kyu Kwak, Yongin-si (KR)

(73) Assignee: Samsung Display Co., Ltd., Yongin-si (KR)

(21) Appl. No.: 17/409,647

(22) Filed: Aug. 23, 2021

Related U.S. Patent Documents

Reissue of:
(64) Patent No.: 8,674,346
Issued: Mar. 18, 2014
Appl. No.: 13/200,384
Filed: Sep. 23, 2011

U.S. Applications:
(63) Continuation of application No. 16/023,833, filed on Jun. 29, 2018, now Pat. No. Re. 48,708, which is an
(Continued)

(30) Foreign Application Priority Data

Jan. 10, 2011 (KR) ..... 10-2011-0002303

(51) Int. Cl.
*H10K 59/121* (2023.01)

(52) U.S. Cl.
CPC ..... *H10K 59/1213* (2023.02); *H10K 59/1216* (2023.02)

(58) Field of Classification Search
CPC ..... H01L 27/3262; H01L 27/3265; H01L 27/326; G09G 2300/0465;
(Continued)

(56) References Cited

U.S. PATENT DOCUMENTS 6,522,079 B1 2/2003 Yamada
6,960,890 B2 * 11/2005 Yoneda ..... H01L 27/1296 257/E27.111
(Continued)

FOREIGN PATENT DOCUMENTS

CN 1773717 5/2006
CN 1908787 2/2007
(Continued)

OTHER PUBLICATIONS

Non-Final Office Action dated Dec. 13, 2019, in U.S. Appl. No. 16/023,833.
(Continued)

*Primary Examiner* — Kenneth Whittington
(74) *Attorney, Agent, or Firm* — H.C. Park & Associates, PLC

(57) ABSTRACT

A design for an organic light-emitting display device that increases capacitor capacity and increases aperture ratio by forming an initializing voltage electrode on a different layer than an electrode of the capacitor and forming only one via hole for an entire set of three sub-pixels. One of the source electrodes and the drain electrodes of switching transistors for the three sub-pixels are formed in common, along with the gate electrodes of the switching transistors.

18 Claims, 8 Drawing Sheets

(Amended)

Related U.S. Application Data application for the reissue of Pat. No. 8,674,346, and a continuation of application No. 15/017,094, filed on Feb. 5, 2016, now Pat. No. Re. 46,935, which is an application for the reissue of Pat. No. 8,674,346.

(58) Field of Classification Search

CPC ... G09G 2300/0439; G09G 2300/0861; G09G 3/3225

USPC ..... 257/40, 43, E51.001; 345/211, 204, 76, 345/82, 92; 315/169.3

See application file for complete search history.

(56) References Cited

U.S. PATENT DOCUMENTS

| | | | | |
|---|---|---|---|---|
| 7,696,521 | B2 | 4/2010 | Lee et al. | |
| 2001/0015626 | A1 | 8/2001 | Ozawa | |
| 2003/0178936 | A1 | 9/2003 | Park et al. | |
| 2005/0017649 | A1 | 1/2005 | Tanabe | |
| 2005/0093791 | A1* | 5/2005 | Lo | G09G 3/3233 345/82 |
| 2005/0110028 | A1 | 5/2005 | Park et al. | |
| 2006/0091395 | A1 | 5/2006 | Lee et al. | |
| 2006/0152151 | A1 | 7/2006 | Seo | |
| 2006/0170634 | A1 | 8/2006 | Kwak et al. | |
| 2007/0030233 | A1 | 2/2007 | Chai et al. | |
| 2007/0242004 | A1* | 10/2007 | Ooka | G09G 3/3225 345/76 |
| 2007/0252145 | A1 | 11/2007 | Toyota et al. | |
| 2008/0035931 | A1 | 2/2008 | Kwak et al. | |
| 2008/0036705 | A1 | 2/2008 | Iwashita et al. | |
| 2008/0315189 | A1 | 12/2008 | Lee et al. | |
| 2009/0066236 | A1 | 3/2009 | Sung et al. | |
| 2010/0007681 | A1 | 1/2010 | Kubota | |
| 2010/0134741 | A1 | 6/2010 | Jeong et al. | |
| 2012/0026144 | A1 | 2/2012 | Kang et al. | |

FOREIGN PATENT DOCUMENTS

| | | | |
|---|---|---|---|
| CN | 101330094 | | 12/2008 |
| JP | 2002-299047 | A | 10/2002 |
| JP | 2003-280551 | A | 10/2003 |
| JP | 2006-154495 | A | 6/2006 |
| KR | 10-2006-0087885 | A | 8/2006 |
| KR | 10-0700648 | | 3/2007 |
| KR | 10-0778514 | | 11/2007 |
| KR | 10-2010-0062284 | | 6/2010 |

OTHER PUBLICATIONS

Final Office Action dated Apr. 7, 2020, in U.S. Appl. No. 16/023,833.

Non-Final Office Action dated Dec. 7, 2020, in U.S. Appl. No. 16/023,833.

Notice of Allowance dated Apr. 3, 2021, in U.S. Appl. No. 16/023,833.

Notice of Allowance dated Jun. 5, 2018, in U.S. Appl. No. 15/017,094.

Notice of Allowance dated Feb. 9, 2018, in U.S. Appl. No. 15/017,094.

Notice of Allowance dated Jan. 17, 2018, in U.S. Appl. No. 15/017,094.

Notice of Allowance dated Sep. 5, 2017, in U.S. Appl. No. 15/017,094.

Non-Final Office Action dated Feb. 7, 2017, in U.S. Appl. No. 15/017,094.

Notice of Allowance dated Oct. 30, 2013, in U.S. Appl. No. 13/200,384.

Taiwanese Office Action dated Nov. 17, 2015, in Taiwanese Patent Application No. 20110141352.

Chinese Granted Document dated Mar. 30, 2016, in Chinese Patent Application No. 201110393833.5.

Korean Registration Determination Certificate dated Dec. 17, 2012 in connection with Korean Patent Application No. 10-2011-0002303 and Request for Entry of the Accompanying Registration Determination Certificate attached herewith.

* cited by examiner

FIG. 3 (Amended)
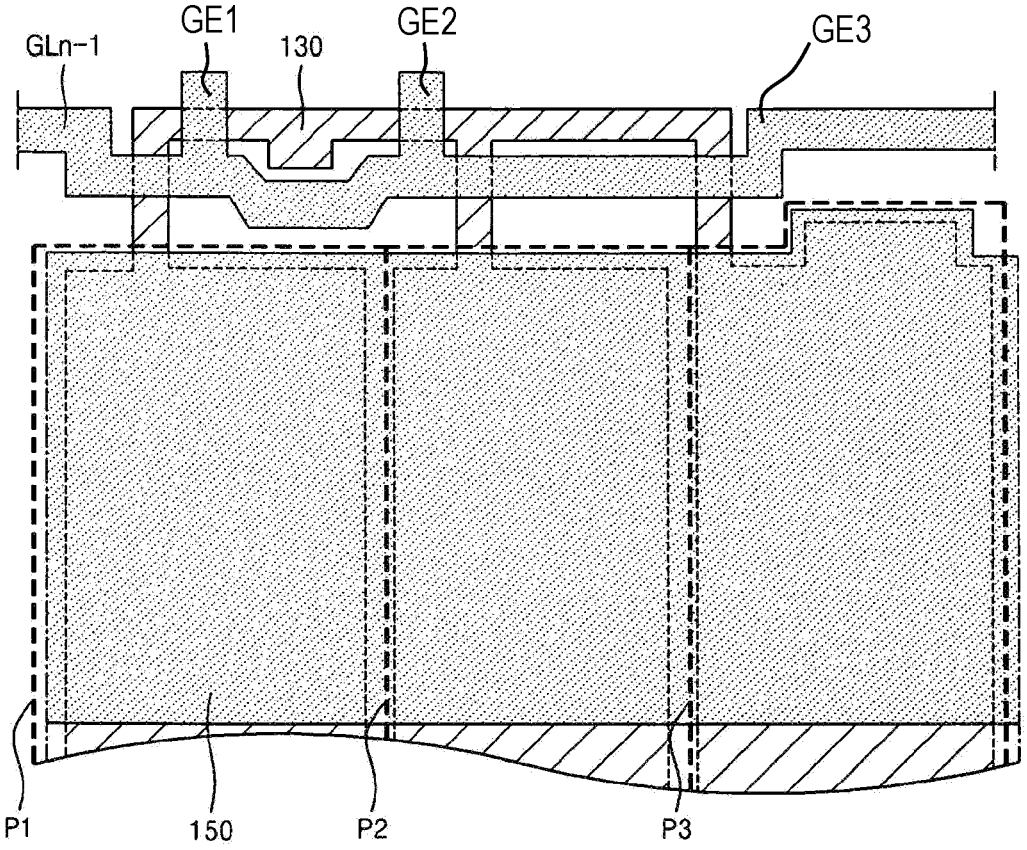

FIG. 5 (Amended)
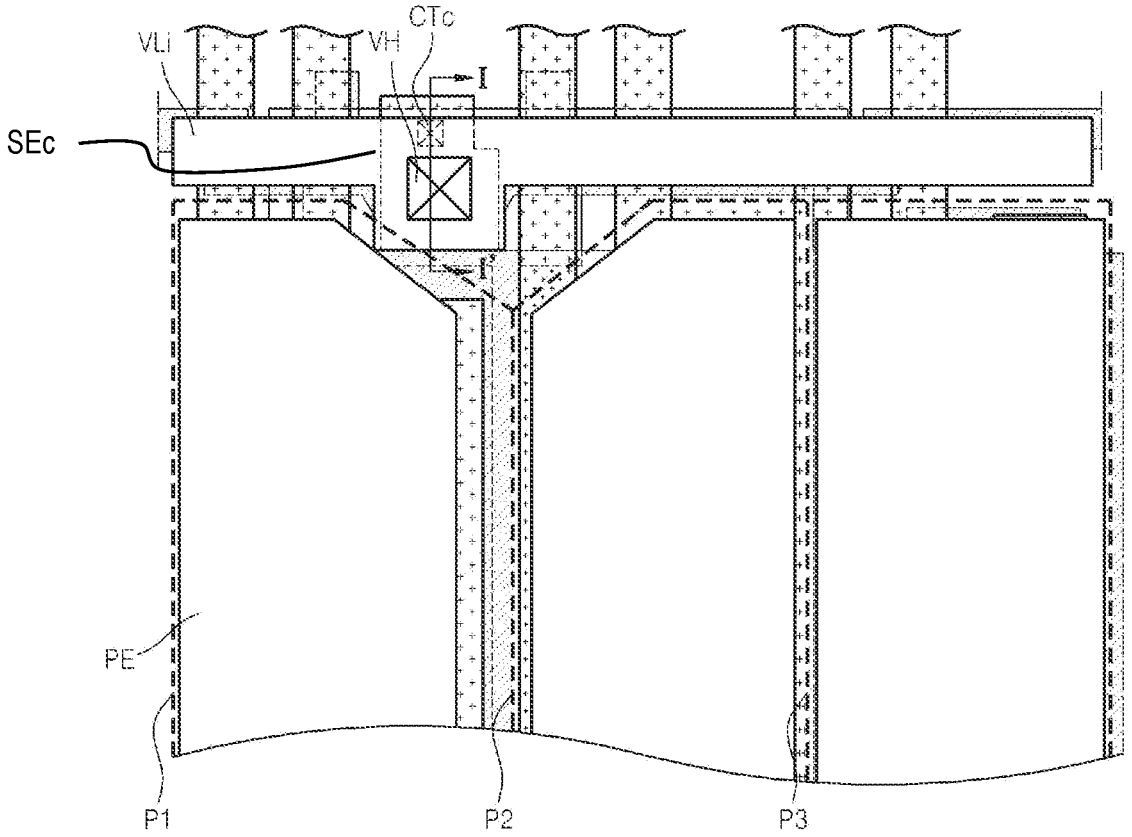

FIG. 9 (Amended)
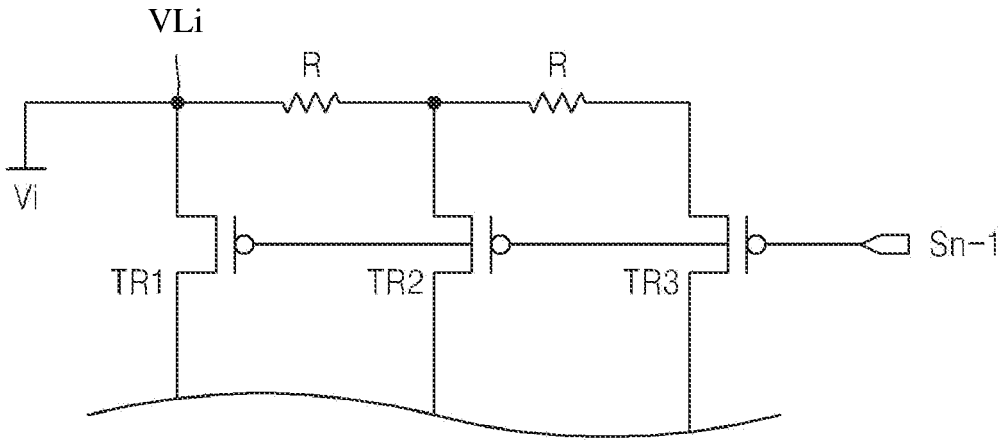

ORGANIC LIGHT EMITTING DISPLAY DEVICE AND METHOD OF MANUFACTURING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*More than one reissue application has been filed for the reissue of U.S. Pat. No. 8,674,346. The reissue applications include U.S. patent application Ser. No. 15/017,094, filed on Feb. 5, 2016, and issued as RE46,935 (grandparent reissue application), U.S. patent application Ser. No. 16/023,833, filed on Jun. 29, 2018, and issued as RE48,708 (parent reissue application), and the present continuation reissue application filed on Aug. 23, 2021.*

CLAIM OF PRIORITY

This application [makes reference to, incorporates the same herein, and claims all benefits accruing under 35 U.S.C. § 119 from an application for ORGANIC LIGHT-EMITTING DISPLAY DEVICE AND METHOD OF MANUFACTURING THE SAME earlier filed in the Korean Intellectual Property Office on 10 Jan. 2011 and there duly assigned] *is a continuation reissue application of U.S. patent application Ser. No. 16/023,833, filed on Jun. 29, 2018, and issued on Aug. 24, 2021, as RE 48,708, which is a continuation reissue application of U.S. Pat. No. 15/017,094, filed on Feb. 5, 2016, and issued on Jul. 3, 2018, as RE46,935, which is a reissue of U.S. Pat. No. 8,674,346, filed on Sep. 23, 2011, as U.S. patent application Ser. No. 13/200,384 and issued on Mar. 18, 2014, and claims priority to and the benefit of* Korean Patent Application No. 10-2011-0002303*, filed on Jan. 10, 2011, each of which is hereby incorporated by reference for all purposes as if fully set forth herein.*

BACKGROUND OF THE INVENTION

1. Field of the Invention

The present invention relates to an organic light-emitting display device and a method of manufacturing the same, and more particularly, to an organic light-emitting display device, including an initializing electrode, including a via-hole for electrically connecting the initializing voltage to switching devices corresponding to each sub-pixel.

2. Description of the Related Art

Organic light-emitting display devices that exhibit superior characteristics in viewing angles, contrast, response speeds, and power consumption have extended their application range from personal portable devices, such as MP3 players or mobile phones, to TVs.

An organic light-emitting display device includes a plurality of pixels, each including at least one capacitor. In this regard, the organic light-emitting display device needs to secure a high charging capacity in order to realize a pixel having a higher resolution. However, when an initializing electrode that applies an initializing voltage is made out of the same material and is formed from the same layer as a gate electrode, a space for realizing a capacitor having a high charging capacity cannot be secured.

Also, even if an initializing electrode is replaced with a wiring of another layer in order to realize a capacitor having a high charging capacity in an organic light-emitting display device, a via-hole for electrically connecting the initializing electrode to switching devices corresponding to each sub-pixel is formed in the sub-pixel in order to apply the initializing voltage. Thus, a size of a pixel opening may be reduced by an extent corresponding to an area in which the via-hole is formed. What is therefore needed is a design for an organic light-emitting display device and a method of making the same that provides for both increased capacitor capacity and increased pixel size.

SUMMARY OF THE INVENTION

The present invention provides an organic light-emitting display device in which an initializing electrode applying an initializing voltage is made out of the same material and is formed from the same layer as a pixel electrode of an organic light-emitting device, and a method of manufacturing the organic light-emitting display device.

According to one aspect of the present invention, there is provided an organic light-emitting display device that includes first through third sub-pixels each comprising at least one capacitor, at least one thin-film transistor (TFT), and an organic light-emitting device (OLED), first through third switching devices including one of a common source electrode and a common drain electrode, the first through third switching devices being electrically connected to the first through third sub-pixels, respectively to apply an initializing voltage to the first through third sub-pixels when the first through third switching devices are turned on, a planarization layer arranged on the first through third switching devices, a via-hole arranged through the planarization layer to expose the one of [a] *the* common source electrode and [a] *the* common drain electrode, and an initializing electrode electrically connected to the one of [a] *the* common source electrode and [a] *the* common drain electrode through the via-hole, the initializing electrode *being configured* to transmit the initializing voltage to the one of [a] *the* common source electrode and [a] *the* common drain electrode.

The organic light-emitting display device may be composed of [just] *only* one [via hole] *via-hole* to serve first through third sub-pixels. Each organic light-emitting device may include a pixel electrode, a counter electrode and an organic layer arranged between the pixel electrode and the counter electrode. The initializing electrode may include [a] *the* same material and *may* be arranged on [a] *the* same layer as the pixel electrode. The first switching device may include a first active layer [to form] *forming* a channel, a first gate electrode insulated from the first active layer, a first source electrode electrically connected to the first active layer, and a first drain electrode[; wherein the]. *The* second switching device may include a second active layer [to form] *forming* a channel, a second gate electrode insulated from the second active layer, a second source electrode electrically connected to the second active layer, and a second drain electrode[; wherein the]. *The* third switching device may include a third active layer [to form] *forming* a channel, a third gate electrode insulated from the third active layer, a third source electrode electrically connected to the third active layer, and a third drain electrode[; and wherein the]. *The* first through third source electrodes *may* commonly constitute a common source electrode.

The first through third active layers may be connected together. The first through third gate electrodes may be connected together. The organic light-emitting display device may also include a gate insulating layer arranged between the first through third active layers and the first through third gate electrodes, an insulating interlayer arranged on the first through third gate electrodes, and a common contact hole arranged in the gate insulating layer and in the insulating interlayer to electrically connect the common source electrode to the first through third active layers. The organic light-emitting display device may be composed of [just] *only* one common contact hole to serve the first through third sub-pixels. The common contact hole may be arranged near the via-hole.

According to another aspect of the present invention, there is provided a method of manufacturing an organic light-emitting display device, including*:* defining first through third sub-pixels each [comprising] *including* at least one capacitor, at least one thin-film transistor (TFT), and an organic light-emitting device (OLED)[,]*;* forming first through third switching devices electrically connected to *the* first through third sub-pixels, respectively, the first through third switching devices [include] *including* one of a commonly formed drain electrode or a commonly formed source electrode, the first through third switching devices *disposed* to apply an initializing voltage to the first through third sub-pixels when the first through third switching devices are turned on[,]*;* forming a planarization layer on the first through third switching devices[,]*;* forming a via-hole through the planarization layer to expose the one of a commonly formed drain electrode or a commonly formed source electrode*;* and forming an initializing electrode electrically connected to the one of [a] *the* commonly formed drain electrode or [a] *the* commonly formed source electrode via the via-hole to transmit the initializing voltage to the one of [a] *the* commonly formed drain electrode or [a] *the* commonly formed source electrode.

The organic light-emitting display device may be composed of [just] *only* one [via hole] *via-hole* to serve *the* first through third sub-pixels. Each organic light-emitting device may include a pixel electrode, a counter electrode and an organic layer arranged between the pixel electrode and the counter electrode. The initializing electrode may include [a] *the* same material and *may* be arranged on the same layer as the pixel electrode. The first switching device may be formed by sequentially forming a first active layer to form a channel, a first gate electrode insulated from the first active layer, a first source electrode electrically connected to the first active layer, and a first drain electrode[; the]. *The* second switching device may be formed by sequentially forming a second active layer to form a channel, a second gate electrode insulated from the second active layer, a second source electrode electrically connected to the second active layer, and a second drain electrode[; the]. *The* third switching device may be formed by sequentially forming a third active layer to form a channel, a third gate electrode insulated from the third active layer, a third source electrode electrically connected to the third active layer, and a third drain electrode[; and wherein the]. *The* first through third source electrodes *may* commonly constitute a common source electrode.

The first through third active layers may be connected together. The first through third gate electrodes may be connected together. The method may also include forming a gate insulating layer between the first through third active layers and the first through third gate electrodes, forming an insulating interlayer on the first through third gate electrodes and forming a common contact hole in the gate insulating layer and in the insulating interlayer to electrically connect the common source electrode to the first through third active layers. The organic light-emitting display device may be composed of [just] *only* one common contact hole to serve the first through third sub-pixels. The common contact hole may be formed in a vicinity of the via-hole.

*According to another aspect of the invention, an organic light-emitting display device includes: first through third sub-pixels each comprising at least one capacitor, at least one thin-film transistor (TFT), and an organic light-emitting device (OLED) including a pixel electrode; first, second and third switching devices including a common active layer and one of a common source electrode and a common drain electrode, the first, second and third switching devices being electrically connected to the first through third sub-pixels, respectively to apply an initializing voltage to the first, second and third sub-pixels when the first, second and third switching devices are turned on; a planarization layer; a via hole in the planarization layer; and an initializing electrode disposed on a same layer as one of the pixel electrodes and electrically connected to the one of a common source electrode and a common drain electrode through the via hole to transmit the initializing voltage to the one of a common source electrode and a common drain electrode.*

*The first switching device may include a first gate electrode insulated from the common active layer, a first source electrode electrically connected to the common active layer, and a first drain electrode; wherein the second switching device may include a second gate electrode insulated from the common active layer, a second source electrode electrically connected to the common active layer, and a second drain electrode; wherein the third switching device may include a third gate electrode insulated from the common active layer, a third source electrode electrically connected to the common active layer, and a third drain electrode; and wherein the first through third source electrodes commonly constitute a common source electrode.*

*The first, second and third gate electrodes may be connected together.*

*The organic light-emitting display device may further include a gate insulating layer disposed between the common active layer and the first through third gate electrodes, an insulating interlayer disposed on the first, second and third gate electrodes, and a common contact hole defined in the gate insulating layer and in the insulating interlayer to electrically connect the common source electrode to the common active layer.*

*The organic light-emitting display device may be composed of just one common contact hole to serve the first, second and third sub-pixels.*

*The planarization layer may be disposed on the first, second and third switching devices, and the via hole may expose the one of a common source electrode and a common drain electrode*

*The organic light-emitting display device may be composed of just one via hole to serve first, second and third sub-pixels.*

*The organic light-emitting display device may further include a gate insulating layer between the common active layer and the first through third gate electrodes, an insulating interlayer disposed on the first, second and third gate electrodes, a common contact hole defined in the gate insulating layer and in the insulating interlayer to electrically connect the common source electrode to the common active layer, a planarization layer disposed on the first, second and third switching devices, and a via hole defined in the planarization layer to expose the one of a common source electrode and a common drain electrode, wherein the*

*initializing electrode is electrically connected to the one of a common source electrode and a common drain electrode through the via hole, and wherein the common contact hole is arranged near the via-hole.*

*The common contact hole may not overlap the via-hole.*

*According to another aspect of the invention, a method of manufacturing an organic light-emitting display device includes: defining first through third sub-pixels each including at least one capacitor, at least one thin-film transistor (TFT), and an organic light-emitting device (OLED) including a pixel electrode; forming first through third switching devices electrically connected to first through third sub-pixels, respectively, the first through third switching devices including a common active layer and one of a commonly formed drain electrode or a commonly formed source electrode, the first through third switching devices applying an initializing voltage to the first through third sub-pixels when the first through third switching devices are turned on; forming a planarization layer; forming a via hole through the planarization layer; and forming an initializing electrode on a same layer as one of the pixel electrodes, the initializing electrode being electrically connected to the one of a commonly formed drain electrode or a commonly formed source electrode through the via hole to transmit the initializing voltage to the one of a commonly formed drain electrode or a commonly formed source electrode.*

*The first switching device may be formed by sequentially forming a first gate electrode insulated from the common active layer, a first source electrode electrically connected to the common active layer, and a first drain electrode, the second switching device may be formed by sequentially forming a second gate electrode insulated from the common active layer, a second source electrode electrically connected to the common active layer, and a second drain electrode, the third switching device may formed by sequentially forming a third gate electrode insulated from the common active layer, a third source electrode electrically connected to the common active layer, and a third drain electrode, and wherein the first through third source electrodes may commonly constitute a common source electrode.*

*The first through third gate electrodes may be connected together.*

*The method may further include forming a gate insulating layer between the common active layer and the first through third gate electrodes, forming an insulating interlayer on the first through third gate electrodes, and forming a common contact hole in the gate insulating layer and in the insulating interlayer to electrically connect the common source electrode to the common active layer.*

*The organic light-emitting display device may be composed of just one common contact hole to serve the first through third sub-pixels.*

*The step of forming a planarization layer may include forming the planarization layer on the first, second and third switching devices, and the step of forming a via hole through the planarization layer may include exposing the one of a commonly formed source electrode and a commonly formed drain electrode.*

*The organic light-emitting display device may be composed of just one via hole to serve first, second and third sub-pixels.*

*The method may further include forming a gate insulating layer between the common active layer and the first through third gate electrodes, forming an insulating interlayer on the first, second and third gate electrodes, forming a common contact hole in the gate insulating layer and in the insulating interlayer to electrically connect the common source electrode to the common active layer, forming a planarization layer on the first, second and third switching devices, and forming a via hole in the planarization layer to expose the one of a common source electrode and a common drain electrode, wherein the initializing electrode is electrically connected to the one of a common source electrode and a common drain electrode through the via hole, and wherein the common contact hole is arranged near the via-hole.*

*The common contact may not overlap the via-hole.*

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components:

FIG. 3 is a diagram illustrating the organic light-emitting display device of FIG. 2 further including a gate electrode layer according to an embodiment of the present invention;

FIG. 5 is a diagram illustrating the organic light-emitting display device of FIG. 4 further including a pixel electrode layer according to an embodiment of the present invention;

FIG. 9 is a circuit diagram illustrating switching devices according to an embodiment of the present invention.

DETAILED DESCRIPTION OF THE INVENTION

Figure 1:
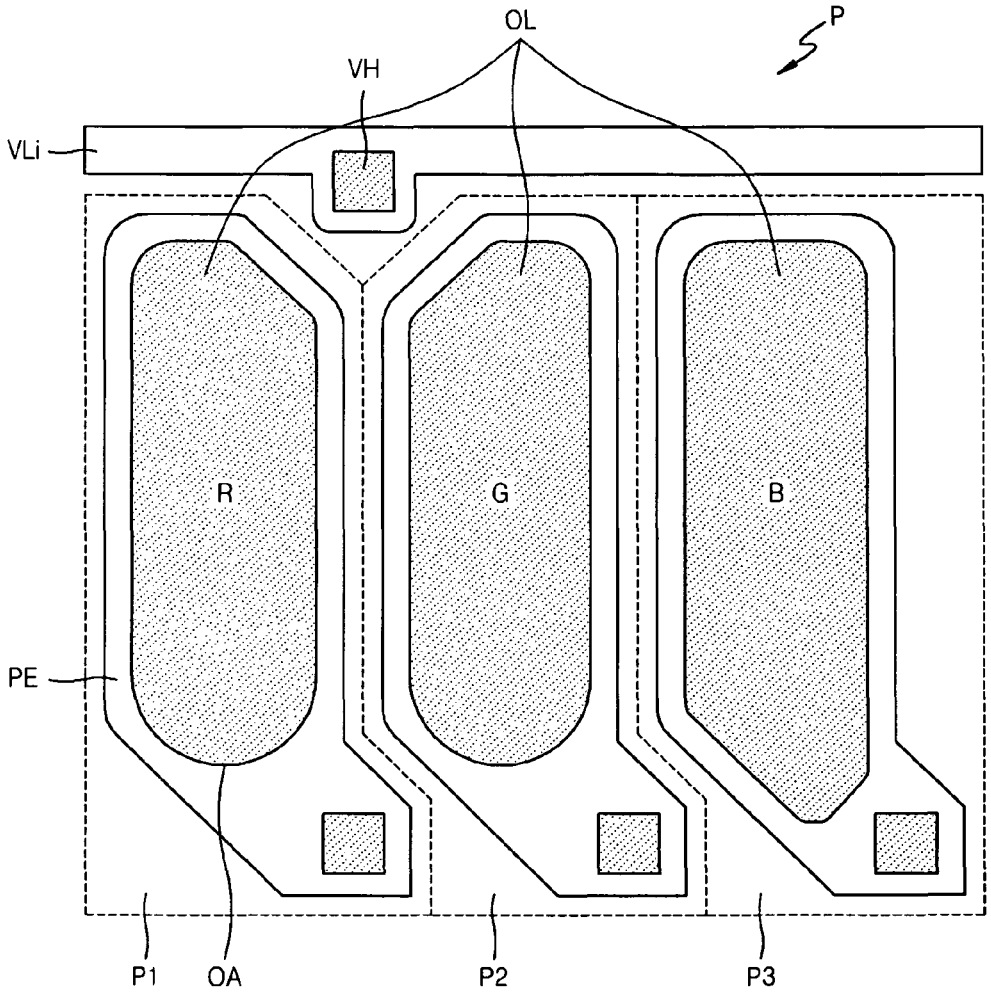
FIG. 1 is a diagram illustrating an organic light-emitting display device including a pixel electrode and an organic layer according to an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

In the present specification, the terms such as "first" and "second" are used herein merely to describe a variety of constituent elements, but the constituent elements are not limited by the terms. The terms are used only for the purpose of distinguishing one constituent element from another constituent element.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

One or more embodiments of the present invention will be described in detail with reference to the accompanying drawings.

Figure 2:
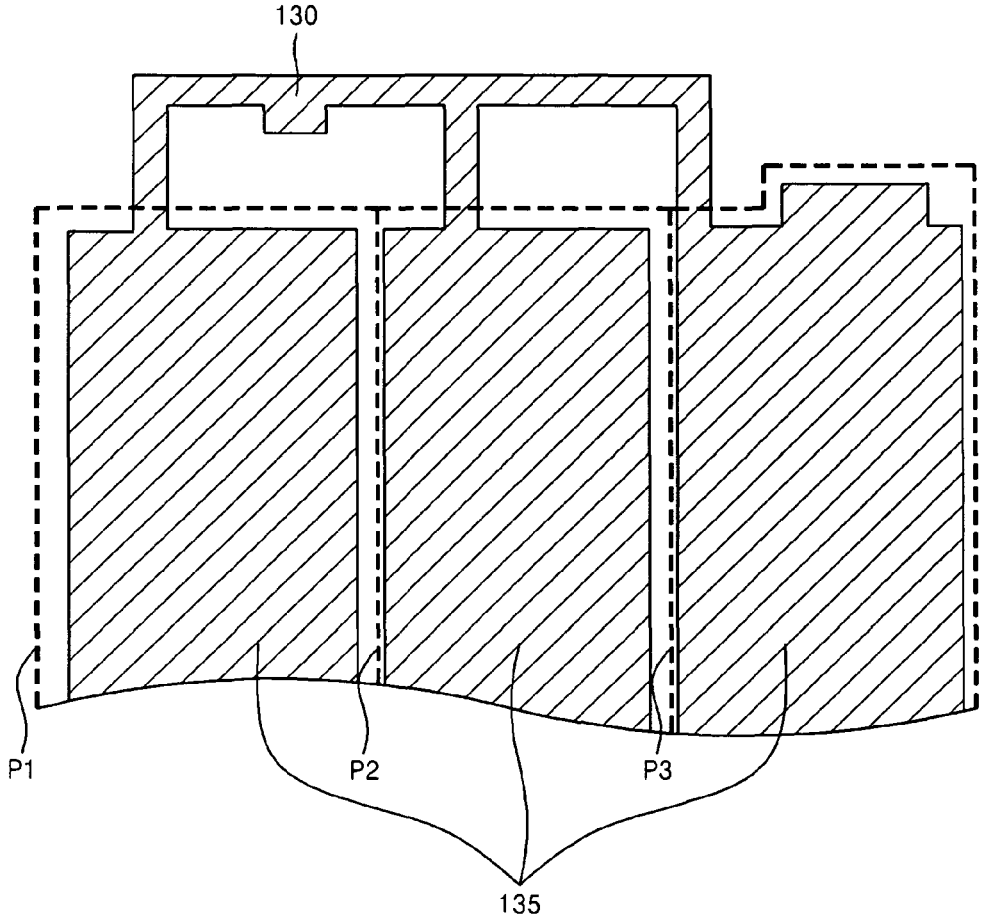
FIG. 2 is a diagram illustrating an active layer of the organic light-emitting display device of FIG. 1.
Figure 4:
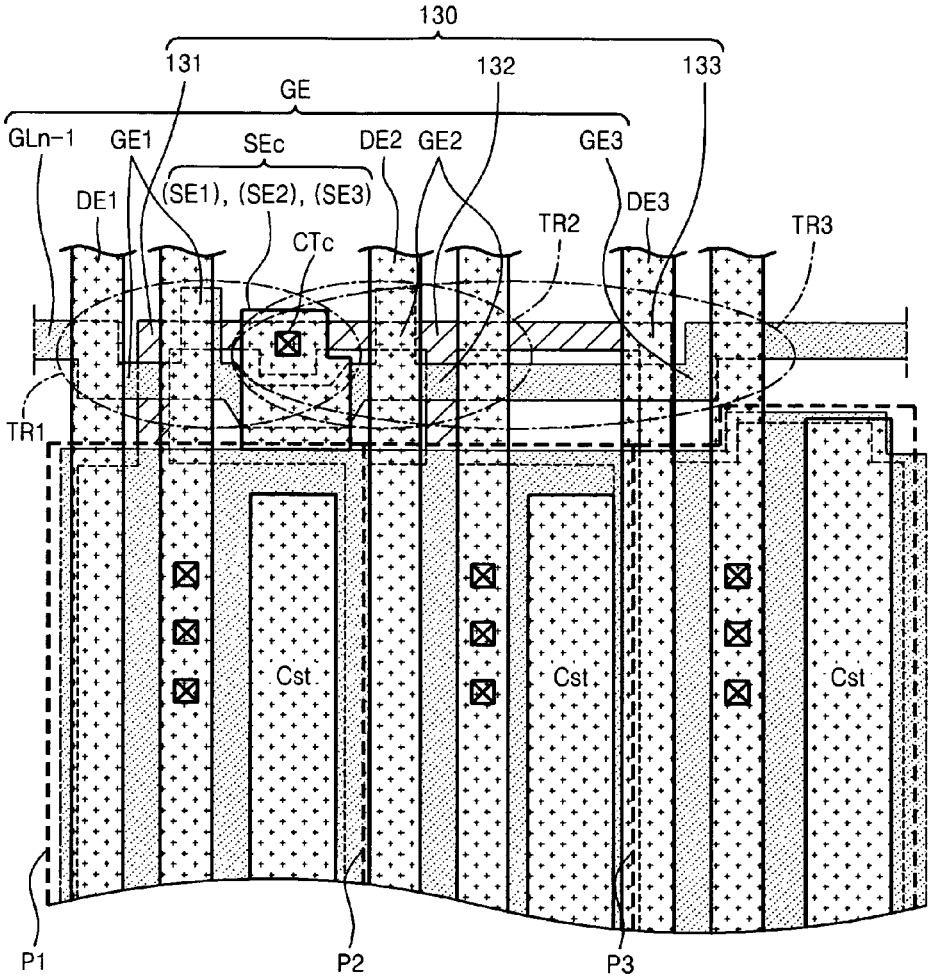
FIG. 4 is a diagram illustrating the organic light-emitting display device of FIG. 3 further including a source/drain electrode layer according to an embodiment of the present invention.
Figure 6:
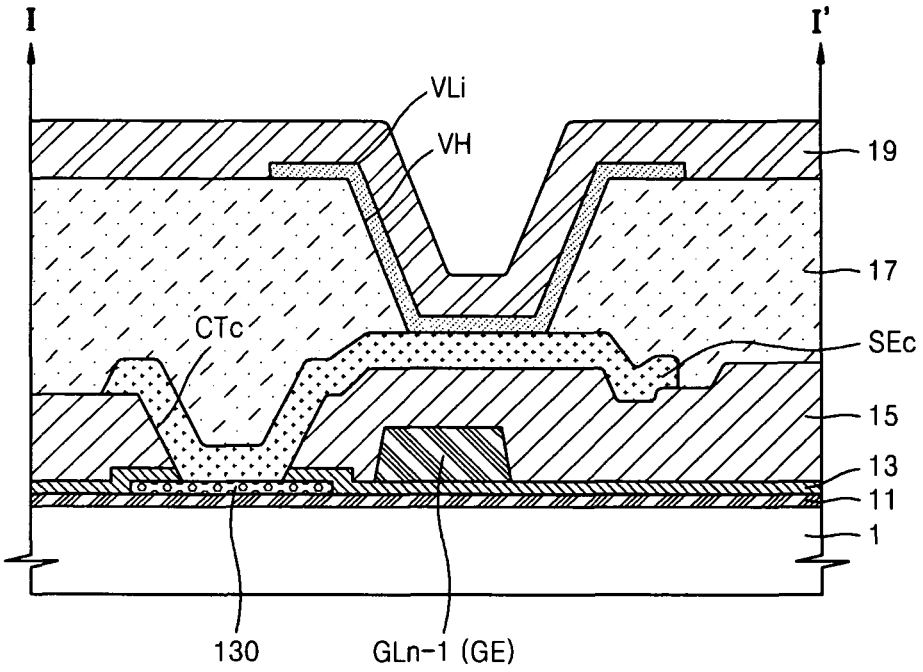
FIG. 6 is a cross-sectional view taken along a line I-I' of FIG. 5.
Figure 7:
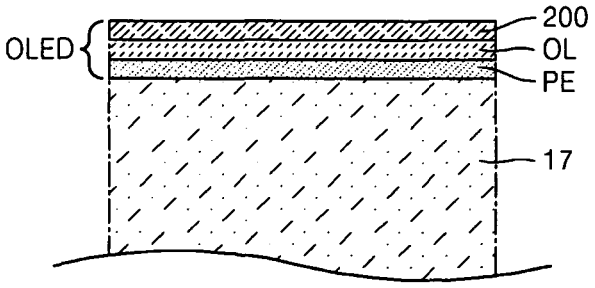
FIG. 7 is a partial cross-sectional view of an organic light-emitting device included in the organic light-emitting display device of FIG. 1.

Turning now to the figures, FIG. 1 is a diagram illustrating a pixel electrode PE and an organic layer OL of an organic light-emitting display device according to an embodiment of the present invention, FIG. 2 is a diagram illustrating an active layer 130 of the organic light-emitting display device of FIG. 1, FIG. 3 is a diagram illustrating the organic light-emitting display device of FIG. 2 further including a gate electrode GE layer, FIG. 4 is a diagram illustrating the organic light-emitting display device of FIG. 3 further including a layer including a plurality of source and drain electrodes SE and DE, FIG. 5 is a diagram illustrating the organic light-emitting display device of FIG. 4 further including a pixel electrode PE layer, FIG. 6 is a cross-sectional view taken along a line I-I' of FIG. 5 and FIG. 7 is a partial cross-sectional view of an organic light-emitting device (OLED) included in the organic light-emitting display device of FIG. 1.

First, first, second, and third sub-pixels P1, P2, and P3 each including first through third switching devices TR1 through TR3 and various circuit components are formed on a substrate 1 or on a buffer layer 11 formed on the substrate 1.

Referring to FIG. 1, the organic light-emitting display device of the current embodiment includes the first, second, and third sub-pixels P1, P2, and P3. The first, second, and third sub-pixels P1, P2, and P3 may constitute a single unit pixel P. For example, the single unit pixel P may include a red sub-pixel R, a green sub-pixel G, and a blue sub-pixel B, however the present invention is not limited thereto. Hereinafter, the red sub-pixel R, the green sub-pixel G, and the blue sub-pixel B may respectively refer to the first sub-pixel P1, the second sub-pixel P2, and the third sub-pixel P3.

Each of the first through third sub-pixels P1 through P3 may include at least one capacitor Cst, at least one thin-film transistor (TFT), and an OLED. For example, each sub-pixel may include six TFTs and two capacitors Cst. In this regard, the TFTs may include a driving transistor that is electrically connected to the OLED and at least one switching transistor. According to the current embodiment of the present invention, the TFT and the capacitor Cst that are included in each sub-pixel may be turned-on to be electrically connected to a switching device receiving an initializing voltage or signal. For example, the first sub-pixel P1, the second sub-pixel P2, and the third sub-pixel P3 are electrically connected to the first switching device TR1, the second switching device TR2, and the third switching device TR3, respectively. In this regard, each of the first through third switching devices TR1 through TR3 may be a kind of TFT.

Referring now to FIG. 4, the first switching device TR1 includes a first active layer 131 to form a channel, a first gate electrode GE1 insulated from the first active layer 131, a first source electrode SE1 and a first drain electrode DE1 electrically connected to the first active layer 131. The second switching device TR2 includes a second active layer 132 to form a channel, a second gate electrode GE2 insulated from the second active layer 132, a second source electrode SE2 and a second drain electrode DE2 electrically connected to the second active layer 132. The third switching device TR3 includes a third active layer 133 to form a channel, a third gate electrode GE3 insulated from the third active layer 133, a third source electrode SE3 and a third drain electrode DE3 electrically connected to the third active layer 133.

Referring now to FIG. 2, the first active layer 131, the second active layer 132, and the third active layer 133 are connected to one another and are illustrated as the active layer 130 in FIG. 2. The first through third active layers 131 through 133 are formed together when another active layer 135 is formed. For example, the active layer 130 may be made out of an amorphous silicon layer, a polycrystal silicon layer, or an oxide semiconductor layer such as a G-I—Z—O layer [$(In_2O_3)_a(Ga_2O_3)_b(ZnO)_c$ layer, wherein a, b, and c are real numbers that satisfy conditions a≥0, b≥0, and c>0, respectively]. According to the current embodiment of the present invention, the first through third active layers 131 through 133 are connected to one another, and thus an initializing signal applied from an initializing electrode VLi (see FIG. 5) may be transmitted to the first through third sub-pixels P1 through P3.

Referring now to FIG. 3, the first through third gate electrodes GE1 through GE3 are connected to one another. The first through third gate electrodes GE1 through GE3 are formed together when an n-1-th gate line GLn-1 and another gate electrode 150 are formed. In this regard, the n-1-th gate line GLn-1 transmits an n-1-th scanning signal Sn-1 to turn on the first through third switching devices TR1 through TR3.

Referring now to FIG. 4, according to the current embodiment of the present invention, the first through third switching devices TR1 through TR3 may include one of a commonly formed drain electrode or a commonly formed source electrode. In detail, referring to FIG. 4, the first through third switching devices TR1 through TR3 may commonly form the first source electrode SE1, the second source electrode SE2, and the third source electrode SE3. Accordingly, the source electrodes commonly formed may be referred to a common source electrode SEc. Also, as illustrated in FIG. 4, the common source electrode SEc has an island shape and may be arranged to be spaced apart from other [wirings] *wiring* formed from the same layer which [form] *forms* the drain electrode and a lower electrode of the capacitor Cst, however, although not shown, the present invention is not limited thereto. Alternatively, the first drain electrode DE1, the second drain electrode DE2, and the third drain electrode DE3 may be commonly formed, which may refer to a common drain electrode.

According to the current embodiment of the present invention, an organic light-emitting display device includes just a single via-hole VH is formed to provide electrical connection to the common source electrode SEc to deliver an initializing signal to each of the first through third sub-pixels P1 through P3. Also, a scanning signal *that* is transmitted to the first through third gate electrodes GE1 through GE3, and thus each of the first through third switching devices TR1 through TR3 are turned on. Then, an initializing signal is applied to the common source electrode SEc and a channel is formed in each of the first through third active layers 131 through 133, and thus the initializing signal may be transmitted to the first through third drain electrodes DE1 through DE3. That is, the first through third switching devices TR1 through TR3 may simultaneously transmit the initializing signal to the first through third sub-pixels P1 through P3 due to the common source electrode SEc.

Referring now to FIG. 6, a gate insulating layer 13 for insulating the active layer 130 from the gate electrode GE layer may be formed between the active layer 130 and the gate electrode GE. Also, and insulating interlayer 15 is formed on the gate electrode GE. The gate insulating layer 13 and the insulating interlayer 15 may be made out of silicon oxide, tantalum oxide, aluminum oxide, or the like, but the present invention is not limited thereto.

Referring now to FIGS. 4 and 6, also, the common contact hole CTc may be formed in the gate insulating layer 13 and in the insulating interlayer 15 to electrically connect the common source electrode SEc to the active layer 130. That is, the common contact hole CTc is formed in portions where the gate insulating layer 13 and the insulating interlayer 15 are partially removed, to expose the active layer 130 in correspondence to an area where the common source electrode SEc is to be formed. Since the common contact hole CTc is related to the common source electrode SEc, just one common contact hole CTc is needed to provide electrical connection from common source electrode SEc to each of first through third sub-pixels P1 through P3.

Referring now to FIG. 4, the first through third drain electrodes DE1 through DE3 may also be electrically connected to the active layer 130. Although not shown in FIG. 4, each of the first through third drain electrodes DE1 through DE3 contacts and is electrically connected to the other active layer 135 that is connected to the first through third active layers 131 through 133, however the present invention is not limited thereto. Each of the first through third drain electrodes DE1 through DE3 may instead contact and be electrically connected to any portion of the active layer 130.

Referring now to FIG. 6, a planarization layer 17 is formed on the first through third switching devices TR1 through TR3. In detail, the planarization layer 17 is formed on each of the first through third drain electrodes DE1 through DE3 and the common source electrode SEc. The planarization layer 17 may be formed to planarize an uneven surface due to the underlying structure, however, the present invention is not limited thereto. A passivation layer for protecting the switching devices may further be formed under the planarization layer 17.

The via-hole VH is formed in the planarization layer 17. The via-hole VH is formed in portions where the planarization layer 17 is partially removed, to expose the common source electrode SEc in correspondence to an area where the common source electrode SEc is arranged. The via-hole VH is arranged at a location that corresponds to the common source electrode SEc, and thus just one via hole VH is needed to provide electrical connection to each of the first through third sub-pixels P1 through P3.

The initializing electrode VLi contacts and is electrically connected to the common source electrode SEc via the via-hole VH. Referring to FIG. 5, the via-hole VH may be formed near the common contact hole CTc. The via-hole VH allows the initializing electrode VLi to electrically connect to the common source electrode SEc, and the common contact hole CTc allows the common source electrode SEc to electrically connect to the active layer 130. That is, the via-hole VH is formed to correspond to the common source electrode SEc. According to the current embodiment of the present invention, the common source electrode SEc is formed to have an island shape, and thus the via-hole VH and the common contact hole CTc are formed close to each other.

Referring now to FIG. 5, the initializing electrode VLi receives an initializing voltage or an initializing signal from the outside and transmits the initializing voltage or the initializing signal to the common source electrode SEc electrically connected thereto. According to the current embodiment of the present invention, the initializing electrode VLi may be formed from the same layer as the pixel electrode PE.

Turning now to FIG. 7, [FIG. 7 illustrates] *FIGS. 1 and 7 illustrate* the OLED included in each sub-pixel. The OLED includes the pixel electrode PE formed on the planarization layer 17, the organic light-emitting layer OL formed on the pixel electrode PE, and a counter electrode 200 covering the organic layer OL and formed on the entire sub-pixel. Although not shown in FIG. 7, the OLED is electrically connected to a driving transistor (not shown) included in the sub-pixel. In detail, similar to the first through third switching devices TR1 through TR3, the planarization layer 17 is formed on the driving transistor, and the pixel electrode PE and driving transistor contact each other via a hole formed in the planarization layer 17. After the pixel electrode PE is formed, a pixel-defining layer 19 is formed on at least a part of the pixel electrode PE to expose the at least a part of the pixel electrode PE by a pixel opening OA. The organic light-emitting layer OL is formed on the pixel electrode PE exposed by the pixel opening OA so that the pixel opening OA includes an organic light-emitting layer. As discussed previously in conjunction with FIG. 1, the first through third sub-pixels P1 through P3 may be formed to have different types of organic light-emitting layers. The counter electrode 200 is formed on the organic layer OL and the pixel electrode PE. The counter electrode 200 is formed to entirely cover a layer including the pixel-defining layer 19 and the organic layer OL. Accordingly, if a voltage is applied from the driving transistor to the pixel electrode PE and thus an appropriate voltage condition is formed between the pixel electrode PE and the counter electrode 200, light emission occurs in the OLED.

In a top emission type display, in which an image is displayed toward the counter electrode 200, the pixel electrode PE may be a reflective electrode and the counter electrode 200 may be a light-transmitting type electrode. In this case, the counter electrode 200 may include a semi-transmission reflective layer made out of any one material selected from the group consisting of Ag, Mg, Al, Pt, Pd, Au, Ni, Nd, Ir, Cr, Li, and Ca and formed to be thin, or may include a light-transmitting metal oxide such as indium tin oxide (ITO), indium zinc oxide (IZO), or zinc oxide (ZnO). In a bottom emission type display, the counter electrode 200 may have a reflection function by being deposited with any one material selected from the group consisting of Ag, Mg, Al, Pt, Pd, Au, Ni, Nd, Ir, Cr, Li, and Ca.

When the pixel electrode PE is used as an anode, the pixel electrode PE may include a layer made out of a metal oxide having a high work-function (an absolute value), for example, ITO, IZO, or ZnO. When the pixel electrode PE is used as a cathode, the pixel electrode PE may include a highly conductive metal having a low work-function, for example, Ag, Mg, Al, Pt, Pd, Au, Ni, Nd, Ir, Cr, Li, or Ca. When the pixel electrode PE is used as an anode, the counter electrode 200 may be used as a cathode, or vice-versa.

Also, according to the current embodiment of the present invention, the initializing electrode VLi may be made out of the same material and be arranged on the same layer as the pixel electrode PE. That is, after a metal layer constituting of the pixel electrode PE is formed, the initializing electrode VLi and the pixel electrode PE are patterned at the same time. As illustrated in FIGS. 5 and 6, both the pixel electrode PE and the initializing electrode VLi are formed on the planarization layer 17, and thus both may be formed from the same layer.

First, according to the current embodiment of the present invention, when the initializing electrode VLi and the pixel electrode PE of the OLED are formed from the same layer, a spatial gain is obtained in which the capacitor Cst disposed of a different layer from the pixel electrode PE may be formed to have a high capacity.

When the initializing electrode VLi is formed from the same layer as a gate wiring, a longitudinal length of the sub-pixel is reduced in order to secure a space for the initializing electrode VLi to be disposed in a row direction. The capacitor Cst is formed by using the other gate electrode 150 formed from the same layer as the gate electrode of the sub-pixel as a lower electrode and using a wiring formed from the same layer as the source/drain electrode as an upper electrode. Accordingly, when the longitudinal length of the sub-pixel is reduced in order to secure a space for the initializing electrode VLi, an area of the capacitor Cst is reduced. Consequently, a high resolution pixel may not secure a sufficient charging capacity. However, according to the current embodiment of the present invention, the area of the capacitor Cst is not reduced by forming the initializing electrode VLi from the pixel electrode PE layer.

Figure 8:
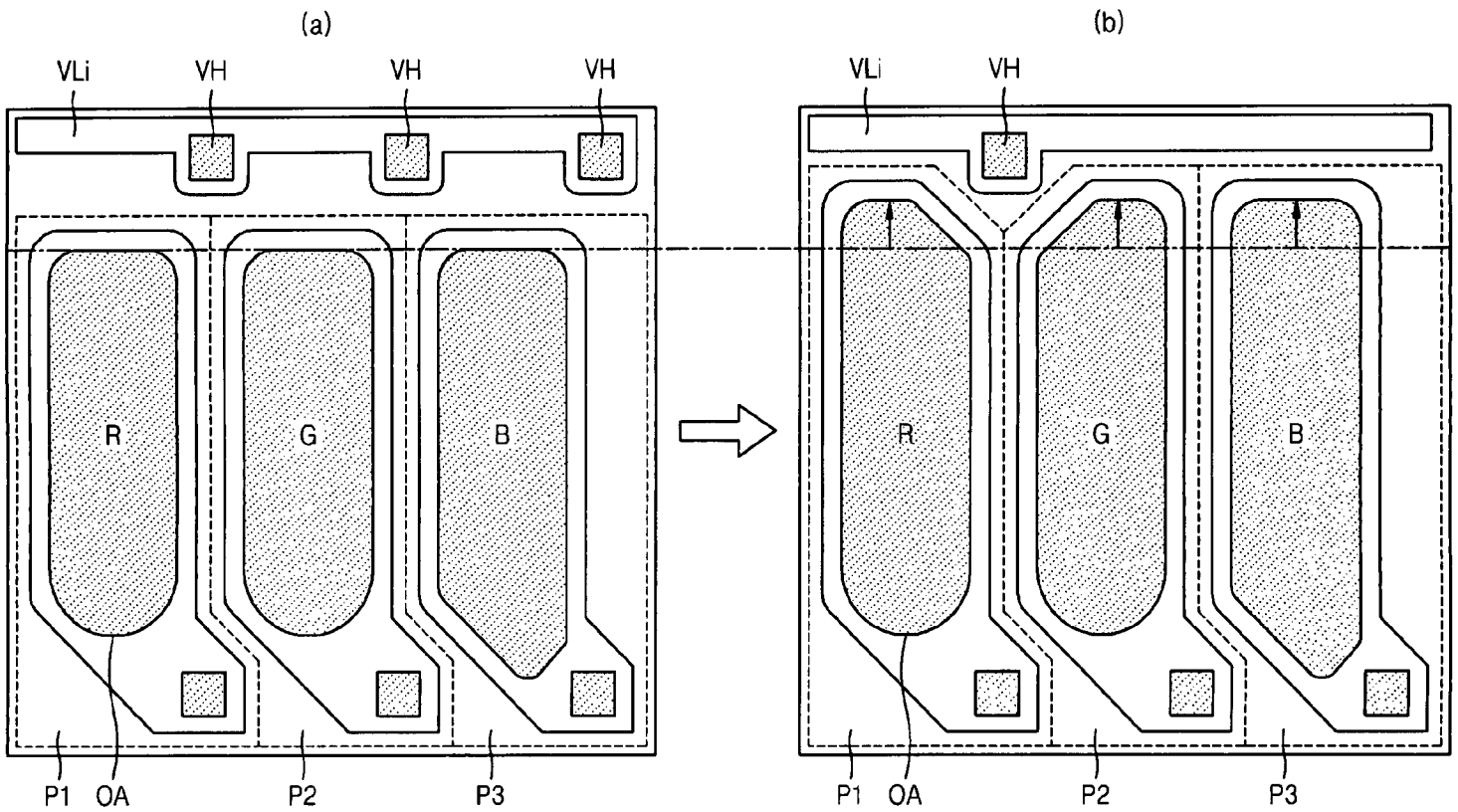
FIG. 8 is a diagram illustrating an organic light-emitting display device according to a comparative example of the present invention and the organic light-emitting display device illustrated in FIG. 1.

Turning now to FIG. 8, FIG. 8 is a diagram illustrating an organic light-emitting display device according to a comparative example of the present invention and the organic light-emitting display device illustrated in FIG. 1. Differences between the organic light-emitting display device according to the comparative example of the present invention and the organic light-emitting display device illustrated in FIG. 1 will now be described with reference to FIG. 8.

FIG. 8(a) illustrates the organic light-emitting display device in which first through third switching devices TR1 through TR3 corresponding to each sub-pixel do not have a common source electrode SEc, and thus a via-hole VH is formed for each sub-pixel.

FIG. 8(b) illustrates the organic light-emitting display device illustrated in FIG. 1 in which the common source electrode SEc is formed *in* common [to] *with* the first through third switching devices TR1 through TR3 respectively corresponding to the first through third sub-pixels P1 through P3, and thus a single via-hole VH is formed common to the first through third sub-pixels P1 through P3.

Referring to FIG. 8(b), an area where the via-holes VH of FIG. 8(a) are formed may provide a space where the pixel openings OA may be formed larger. In this regard, the pixel opening OA, as described above, is a portion where the pixel-defining layer 19 is removed from at least a part of an upper portion of the pixel electrode PE to expose at least apart of the pixel electrode PE and where light emission occurs, wherein the pixel opening OA is covered by the organic light-emitting layer OL. Experimentally, aperture ratios of the first and second sub-pixels P1 and P2 of FIG. 8(b) are increased by about 11.7%, compared to those of FIG. 8(a). Also, an aperture ratio of the third sub-pixel P3 of FIG. 8(b) is increased by about 13.5%, compared to that of FIG. 8(a). As such, an organic light-emitting display device designed to increase an aperture ratio has a longer lifespan and an increased image quality.

Also, the organic light-emitting display device according to the embodiment of the present invention is manufactured according to the above-described operations. In short, the substrate 1 is prepared, and the buffer layer 11 is formed on the substrate 1, and then the active layer 130 is formed on the buffer layer 11, as illustrated in FIG. 2. When the active layer 130 is patterned, the first through third active layers 131 through 133 may be connected to one another. Also, the other active layer 135 to be used as a lower electrode of the capacitor Cst may be patterned to be connected to the first through third active layers 131 through 133.

Next, the gate insulating layer 13 is formed on the active layer 130. Then, as illustrated in FIG. 3, the gate electrode GE layer is formed on the gate insulating layer 13 and is then patterned. At this point, the first through third gate electrodes GE1 through GE3 and the gate line GLn-1 may be patterned to be connected to one another.

Next, the insulating interlayer 15 is formed on the gate electrode *GE*. Then, the common contact hole CTc is formed by partially removing the insulating interlayer 15 and the gate insulating layer 13. Then, as illustrated in FIG. 4, the metal layer is formed thereon and is then patterned to form the source and drain electrodes SE and DE. At this point, the metal layer is patterned to form a wiring corresponding to an upper electrode of capacitor Cst, the common source electrode SEc and the first through third drain electrodes DE1 through DE3. The common source electrode SEc contacts the active layer 130 via the common contact hole CTc.

Next, the planarization layer 17 is formed on the source/drain metal, and the via-hole VH is formed in the planarization layer 17. Then, as illustrated in FIG. 5, a metal pixel electrode PE layer is formed on the planarization layer 17 to form the pixel electrode PE and the initializing electrode VLi by patterning the metal pixel electrode PE layer. In this regard, the initializing electrode VLi contacts the common source electrode SEc via the via-hole VH.

Next, the pixel-defining layer 19 is formed on the pixel electrode PE metal. In this regard, the pixel opening OA is formed in an area of the pixel electrode PE where a light emission unit is to be formed by partially removing the pixel-defining layer 19. The organic light-emitting layer OL is deposited on the pixel electrode PE exposed by the pixel opening OA. Then, the counter electrode 200 is [entirely] formed on the *entireties of the* organic light-emitting layer OL and on the pixel-defining layer 19.

Turning now to FIG. 9, FIG. 9 is a circuit diagram illustrating switching devices according to an embodiment of the present invention. Referring to FIG. 9, unlike FIG. 1, only a single via-hole VH is formed *to accommodate initializing electrode VLi*, and a source terminal of each of first through third switching devices TR1 through TR3 is connected to a common node. Portions illustrated as a resistor R in the common node are portions that are electrically connected to each other by an active layer 130. In FIG. 9, Vi denotes an initializing voltage and Sn-1 denotes an n-1-th scanning signal for turning on each of the first through third switching devices TR1 through TR3.

According to the present invention, when an initializing electrode and a pixel electrode of an OLED are formed from the same layer, a spatial gain is obtained in which a capacitor disposed on a different layer from the pixel electrode may be formed to have a high capacity.

Also, according to the present invention, any one of a drain electrode and a source electrode of switching devices corresponding to each sub-pixel is commonly formed and thus a via-hole is formed common to a plurality of sub-pixels, so that an area where a via-hole is formed in each sub-pixel may provide a space where a pixel opening may be formed larger, thereby increasing an aperture ratio of an organic light-emitting display device.

While the present invention has been particularly shown, and described with reference to exemplary embodiments thereof, it will be understood by those of ordinary skill in the art that various changes in form, and details may be made therein without departing from the spirit, and scope of the present invention as defined by the following claims.

What is claimed:

[1. An organic light-emitting display device, comprising:

first through third sub-pixels each comprising at least one capacitor, at least one thin-film transistor (TFT), and an organic light-emitting device (OLED);

first, second and third switching devices including one of a common source electrode and a common drain electrode, the first, second and third switching devices being electrically connected to the first through third sub-pixels, respectively to apply an initializing voltage to the first, second and third sub-pixels when the first, second and third switching devices are turned on;

a planarization layer arranged on the first, second and third switching devices;

a via-hole arranged through the planarization layer to expose the one of a common source electrode and a common drain electrode; and an initializing electrode electrically connected to the one of a common source electrode and a common drain electrode through the via-hole, the initializing electrode to transmit the initializing voltage to the one of a common source electrode and a common drain electrode.]

[2. The organic light-emitting display device of claim 1, the organic light-emitting display device is composed of just one via hole to serve first, second and third sub-pixels.]

[3. The organic light-emitting display device of claim 1, wherein each organic light-emitting device comprises:

a pixel electrode;

a counter electrode; and an organic layer arranged between the pixel electrode and the counter electrode.]

[4. The organic light-emitting display device of claim 3, wherein the initializing electrode is comprised of a same material and is arranged on a same layer as the pixel electrode.]

[5. The organic light-emitting display device of claim 1, wherein the first switching device comprises:

a first active layer to form a channel, a first gate electrode insulated from the first active layer, a first source electrode electrically connected to the first active layer, and a first drain electrode;

wherein the second switching device comprises:

a second active layer to form a channel, a second gate electrode insulated from the second active layer, a second source electrode electrically connected to the second active layer, and a second drain electrode;

wherein the third switching device comprises:

a third active layer to form a channel, a third gate electrode insulated from the third active layer, a third source electrode electrically connected to the third active layer, and a third drain electrode; and wherein the first through third source electrodes commonly constitute a common source electrode.]

[6. The organic light-emitting display device of claim 5, wherein the first, second and third active layers are connected together.]

[7. The organic light-emitting display device of claim 5, wherein the first, second and third gate electrodes are connected together.]

[8. The organic light-emitting display device of claim 5, further comprising:

a gate insulating layer arranged between the first, second and third active layers and the first through third gate electrodes;

an insulating interlayer arranged on the first, second and third gate electrodes; and a common contact hole arranged in the gate insulating layer and in the insulating interlayer to electrically connect the common source electrode to the first, second and third active layers.]

[9. The organic light-emitting display device of claim 8, the organic light-emitting display device being composed of just one common contact hole to serve the first, second and third sub-pixels.]

[10. The organic light-emitting display device of claim 8, wherein the common contact hole is arranged near the via-hole.]

[11. A method of manufacturing an organic light-emitting display device, the method comprising:

defining first through third sub-pixels each comprising at least one capacitor, at least one thin-film transistor (TFT), and an organic light-emitting device (OLED);

forming first through third switching devices electrically connected to first through third sub-pixels, respectively, the first through third switching devices include one of a commonly formed drain electrode or a commonly formed source electrode, the first through third switching devices to apply an initializing voltage to the first through third sub-pixels when the first through third switching devices are turned on;

forming a planarization layer on the first through third switching devices;

forming a via-hole through the planarization layer to expose the one of a commonly formed drain electrode or a commonly formed source electrode; and forming an initializing electrode electrically connected to the one of a commonly formed drain electrode or a commonly formed source electrode via the via-hole to transmit the initializing voltage to the one of a commonly formed drain electrode or a commonly formed source electrode.]

[12. The method of claim 11, the organic light-emitting display device is composed of just one via hole to serve first through third sub-pixels.]

[13. The method of claim 11, wherein each organic light-emitting device comprises:

a pixel electrode;

a counter electrode; and an organic layer arranged between the pixel electrode and the counter electrode.]

[14. The method of claim 13, wherein the initializing electrode is comprised of the same material and is arranged on the same layer as the pixel electrode.]

[15. The method of claim 11, wherein the first switching device is formed by sequentially forming a first active layer to form a channel, a first gate electrode insulated from the first active layer, a first source electrode electrically connected to the first active layer, and a first drain electrode; the second switching device is formed by sequentially forming a second active layer to form a channel, a second gate electrode insulated from the second active layer, a second source electrode electrically connected to the second active layer, and a second drain electrode; the third switching device is formed by sequentially forming a third active layer to form a channel, a third gate electrode insulated from the third active layer, a third source electrode electrically connected to the third active layer, and a third drain electrode; and wherein the first through third source electrodes commonly constitute a common source electrode.]

[16. The method of claim 15, wherein the first through third active layers are connected together.]

[17. The method of claim 15, wherein the first through third gate electrodes are connected together.]

[18. The method of claim 15, further comprising:

forming a gate insulating layer between the first through third active layers and the first through third gate electrodes;

forming an insulating interlayer on the first through third gate electrodes; and forming a common contact hole in the gate insulating layer and in the insulating interlayer to electrically connect the common source electrode to the first through third active layers.]

[19. The method of claim 18, the organic light-emitting display device being composed of just one common contact hole to serve the first through third sub-pixels.]

[20. The method of claim 11, wherein the organic light emitting display device comprises:

the first through third sub-pixels each comprising at least one capacitor, at least one thin-film transistor (TFT), and an organic light-emitting device (OLED);

first through third switching devices including one of the commonly formed source electrode and the commonly formed drain electrode, the first through third switching devices being electrically connected to the first through third sub-pixels, respectively to apply the initializing voltage to the first through third sub-pixels when the first through third switching devices are turned on;

the planarization layer arranged on the first through third switching devices;

the via-hole arranged through the planarization layer to expose the one of the commonly formed source electrode and the commonly formed drain electrode; and the initializing electrode electrically connected to the one of the commonly formed source electrode and the commonly formed drain electrode through the via-hole, the initializing electrode to transmit the initializing voltage to the one of the commonly formed source electrode and the commonly formed drain electrode.]

*21. An organic light-emitting display device, comprising:*

*first through third sub-pixels each comprising at least one capacitor, at least one thin-film transistor (TFT), and an organic light-emitting device (OLED) including a pixel electrode;*

*first, second and third switching devices including a common active layer and one of a common source electrode and a common drain electrode, the first, second and third switching devices being electrically connected to the first through third sub-pixels, respectively to apply an initializing voltage to the first, second and third sub-pixels when the first, second and third switching devices are turned on;*

*a planarization layer;*

*a via hole in the planarization layer; and*

*an initializing electrode disposed on a same layer as one of the pixel electrodes and electrically connected to the one of a common source electrode and a common drain electrode through the via hole to transmit the initializing voltage to the one of a common source electrode and a common drain electrode.*

*22. The organic light-emitting display device of claim 21, wherein*

*the first switching device comprises:*

*a first gate electrode insulated from the common active layer,*

*a first source electrode electrically connected to the common active layer, and*

*a first drain electrode;*

*wherein the second switching device comprises:*

*a second gate electrode insulated from the common active layer,*

*a second source electrode electrically connected to the common active layer, and*

*a second drain electrode;*

*wherein the third switching device comprises:*

*a third gate electrode insulated from the common active layer,*

*a third source electrode electrically connected to the common active layer, and*

*a third drain electrode; and*

*wherein the first through third source electrodes commonly constitute a common source electrode.*

*23. The organic light-emitting display device of claim 22, wherein the first, second and third gate electrodes are connected together.*

*24. The organic light-emitting display device of claim 22, further comprising:*

*a gate insulating layer disposed between the common active layer and the first through third gate electrodes;*

*an insulating interlayer disposed on the first, second and third gate electrodes; and*

*a common contact hole defined in the gate insulating layer and in the insulating interlayer to electrically connect the common source electrode to the common active layer.*

*25. The organic light-emitting display device of claim 24, wherein the organic light-emitting display device is composed of just one common contact hole to serve the first, second and third sub-pixels.*

*26. The organic light-emitting display device of claim 22, further comprising:*

*a gate insulating layer between the common active layer and the first through third gate electrodes;*

*an insulating interlayer disposed on the first, second and third gate electrodes; and*

*a common contact hole defined in the gate insulating layer and in the insulating interlayer to electrically connect the common source electrode to the common active layer,*

*wherein the planarization layer is disposed on the first, second and third switching devices; and*

*the via hole exposes the one of a common source electrode and a common drain electrode, and wherein the common contact hole is arranged near the via-hole.*

*27. The organic light-emitting display device of claim 26, wherein the common contact hole does not overlap the via-hole.*

*28. The organic light-emitting display device of claim 21, wherein:*

*the planarization layer is disposed on the first, second and third switching devices; and*

*the via hole exposes the one of a common source electrode and a common drain electrode.*

*29. The organic light-emitting display device of claim 28, the organic light-emitting display device is composed of just one via hole to serve first, second and third sub-pixels.*

*30. A method of manufacturing an organic light-emitting display device, the method comprising:*

*defining first through third sub-pixels each comprising at least one capacitor, at least one thin-film transistor (TFT), and an organic light-emitting device (OLED) including a pixel electrode;*

*forming first through third switching devices electrically connected to first through third sub-pixels, respectively, the first through third switching devices including a common active layer and one of a commonly formed drain electrode or a commonly formed source electrode, the first through third switching devices applying an initializing voltage to the first through third sub-pixels when the first through third switching devices are turned on;*

*forming a planarization layer;*

*forming a via hole through the planarization layer; and*

*forming an initializing electrode on a same layer as one of the pixel electrodes, the initializing electrode being electrically connected to the one of a commonly formed drain electrode or a commonly formed source electrode through the via hole to transmit the initializing voltage to the one of a commonly formed drain electrode or a commonly formed source electrode.*

*31. The method of claim 30, wherein*

*the first switching device is formed by sequentially forming a first gate electrode insulated from the common active layer, a first source electrode electrically connected to the common active layer, and a first drain electrode;*

*the second switching device is formed by sequentially forming a second gate electrode insulated from the common active layer, a second source electrode electrically connected to the common active layer, and a second drain electrode;*

*the third switching device is formed by sequentially forming a third gate electrode insulated from the common active layer, a third source electrode electrically connected to the common active layer, and a third drain electrode; and wherein*

*the first through third source electrodes commonly constitute a common source electrode.*

*32. The method of claim 31, wherein the first through third gate electrodes are connected together.*

*33. The method of claim 31, further comprising:*

*forming a gate insulating layer between the common active layer and the first through third gate electrodes;*

*forming an insulating interlayer on the first through third gate electrodes; and*

*forming a common contact hole in the gate insulating layer and in the insulating interlayer to electrically connect the common source electrode to the common active layer.*

*34. The method of claim 33, the organic light-emitting display device being composed of just one common contact hole to serve the first through third sub-pixels.*

*35. The method of claim 31, further comprising:*

*forming a gate insulating layer between the common active layer and the first through third gate electrodes;*

*forming an insulating interlayer on the first, second and third gate electrodes; and*

*forming a common contact hole in the gate insulating layer and in the insulating interlayer to electrically connect the common source electrode to the common active layer,*

*wherein the planarization layer is formed on the first, second and third switching devices; and*

*the via hole exposes the one of a common source electrode and a common drain electrode, and wherein the common contact hole is arranged near the via-hole.*

*36. The method of claim 35, wherein the common contact hole does not overlap the via-hole.*

*37. The method of claim 30, wherein:*

*the step of forming a planarization layer comprises forming the planarization layer on the first, second and third switching devices; and*

*the step of forming a via hole through the planarization layer comprises exposing the one of a commonly formed source electrode and a commonly formed drain electrode.*

*38. The method of claim 37, the organic light-emitting display device is composed of just one via hole to serve first, second and third sub-pixels.*

* * * * *